(12) United States Patent
Sawada

(10) Patent No.: US 12,317,412 B2
(45) Date of Patent: May 27, 2025

(54) HIGH-FREQUENCY MODULE AND COMMUNICATION DEVICE

(71) Applicant: Murata Manufacturing Co., Ltd., Kyoto (JP)

(72) Inventor: Yoichi Sawada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 149 days.

(21) Appl. No.: 18/164,707

(22) Filed: Feb. 6, 2023

(65) Prior Publication Data

US 2023/0189432 A1    Jun. 15, 2023

Related U.S. Application Data

(63) Continuation of application No. PCT/JP2021/024355, filed on Jun. 28, 2021.

(30) Foreign Application Priority Data

Aug. 31, 2020    (JP) .................................. 2020-146347

(51) Int. Cl.
H05K 1/02    (2006.01)

(52) U.S. Cl.
CPC ......... *H05K 1/0243* (2013.01); *H05K 1/0216* (2013.01); *H05K 2201/10053* (2013.01);
(Continued)

(58) Field of Classification Search
CPC ...... H05K 1/02; H05K 1/0216; H05K 1/0218; H05K 1/0243; H01L 23/498;
(Continued)

(56) References Cited

U.S. PATENT DOCUMENTS 8,102,032 B1 *   1/2012   Bolognia ............ H01L 23/3128
                                                                 257/659
10,636,774 B2 *  4/2020   Yang ...................... H01L 24/20
                          (Continued)

FOREIGN PATENT DOCUMENTS

JP    2018-137522 A    8/2018
JP    2020-102693 A    7/2020
                (Continued)

OTHER PUBLICATIONS

International Search Report for PCT/JP2021/024355 dated Sep. 7, 2021.

*Primary Examiner* — Tuan T Dinh
(74) *Attorney, Agent, or Firm* — McDonald Hopkins LLC

(57) ABSTRACT

A high-frequency module includes a module substrate having main surfaces, one or more module components disposed on the main surface, a resin member covering the main surface, and a metal shield layer covering a top surface of each of the resin member and the one or more module components, and set to ground potential. A sub-module component, which is one of the one or more module components, has a sub-module substrate having main surfaces, a first circuit component disposed on the main surface, one or more second circuit components disposed on the main surface, a resin member covering the main surface, and a side surface shield layer covering a side surface of each of the resin member and the sub-module substrate, and set to the ground potential. An end surface on a top surface side of the side surface shield layer contacts the metal shield layer.

17 Claims, 5 Drawing Sheets

(52) U.S. Cl.
CPC .............. *H05K 2201/1006* (2013.01); *H05K 2201/10098* (2013.01)

(58) Field of Classification Search
CPC ............ H01L 23/49816; H01L 23/552; H01L 23/5385; H01L 23/5383; H01L 23/66; H04B 1/005; H04B 1/0057; H04B 1/006
USPC ....................... 361/770–790, 795, 816, 818; 257/685–690, 700–710, 790
See application file for complete search history.

(56) References Cited

U.S. PATENT DOCUMENTS

| | | | |
|---|---|---|---|
| 10,804,217 B2* | 10/2020 | Cho | H01L 23/3107 |
| 2006/0012037 A1 | 1/2006 | Raedt et al. | |
| 2010/0027225 A1* | 2/2010 | Yuda | H05K 3/4697 |
| | | | 156/247 |
| 2015/0365127 A1* | 12/2015 | Kim | H04L 25/0278 |
| | | | 375/267 |
| 2017/0040304 A1* | 2/2017 | Shih | H01L 23/552 |
| 2018/0096967 A1* | 4/2018 | Tsai | H01L 23/16 |
| 2018/0197821 A1* | 7/2018 | Shin | H01L 23/552 |
| 2018/0261569 A1* | 9/2018 | Yang | H01L 25/0652 |
| 2020/0203291 A1 | 6/2020 | Uejima | |
| 2021/0005579 A1 | 1/2021 | Matsumoto | |

FOREIGN PATENT DOCUMENTS

| | | |
|---|---|---|
| WO | 2014/013831 A1 | 1/2014 |
| WO | 2019/181590 A1 | 9/2019 |

* cited by examiner

HIGH-FREQUENCY MODULE AND COMMUNICATION DEVICE

CROSS REFERENCE TO RELATED APPLICATION

This is a continuation of International Application No. PCT/JP2021/024355 filed on Jun. 28, 2021 which claims priority from Japanese Patent Application No. 2020-146347 filed on Aug. 31, 2020. The contents of these applications are incorporated herein by reference in their entireties.

BACKGROUND ART

Technical Field

The present disclosure relates to a high-frequency module and a communication device.

In a mobile communication device such as a cellular phone, in particular, a disposition configuration of circuit components constituting a high-frequency front-end module is complicated along with a progress of multi-band. Patent Document 1 discloses a front-end circuit in which a power amplifier, a low-noise amplifier, a switch circuit, and a duplexer are packaged.
Patent Document 1: Japanese Unexamined Patent Application Publication No. 2018-137522

BRIEF SUMMARY

In such an existing front-end circuit, there is concern about deterioration of electrical characteristics (for example, a noise figure (NF), gain characteristics, and the like).

The present disclosure provides a high-frequency module and a communication device capable of improving electrical characteristics.

A high-frequency module according to an aspect of the present disclosure includes a first substrate having a first main surface, and a second main surface opposite to the first main surface, one or more module components disposed on the first main surface, a first resin member configured to cover the first main surface, and a first metal shield layer configured to cover a top surface of each of the first resin member and the one or more module components, and to be set to ground potential. Each of the one or more module components has a second substrate having a third main surface, and a fourth main surface opposite to the third main surface, a first circuit component disposed on the third main surface, one or more second circuit components disposed on the third main surface or the fourth main surface, a second resin member covering the third main surface, and a second metal shield layer covering a side surface of each of the second resin member and the second substrate, and set to the ground potential, and an end surface on a top surface side of the second metal shield layer contacts the first metal shield layer.

Additionally, a communication device according to an aspect of the present disclosure includes an RF signal processing circuit configured to process a high-frequency signal transmitted or received by an antenna, and a high-frequency module configured to transmit a high-frequency signal between the antenna and the RF signal processing circuit.

The high-frequency module and the like according to the present disclosure are capable of improving electrical characteristics.

DETAILED DESCRIPTION

Figure 1:
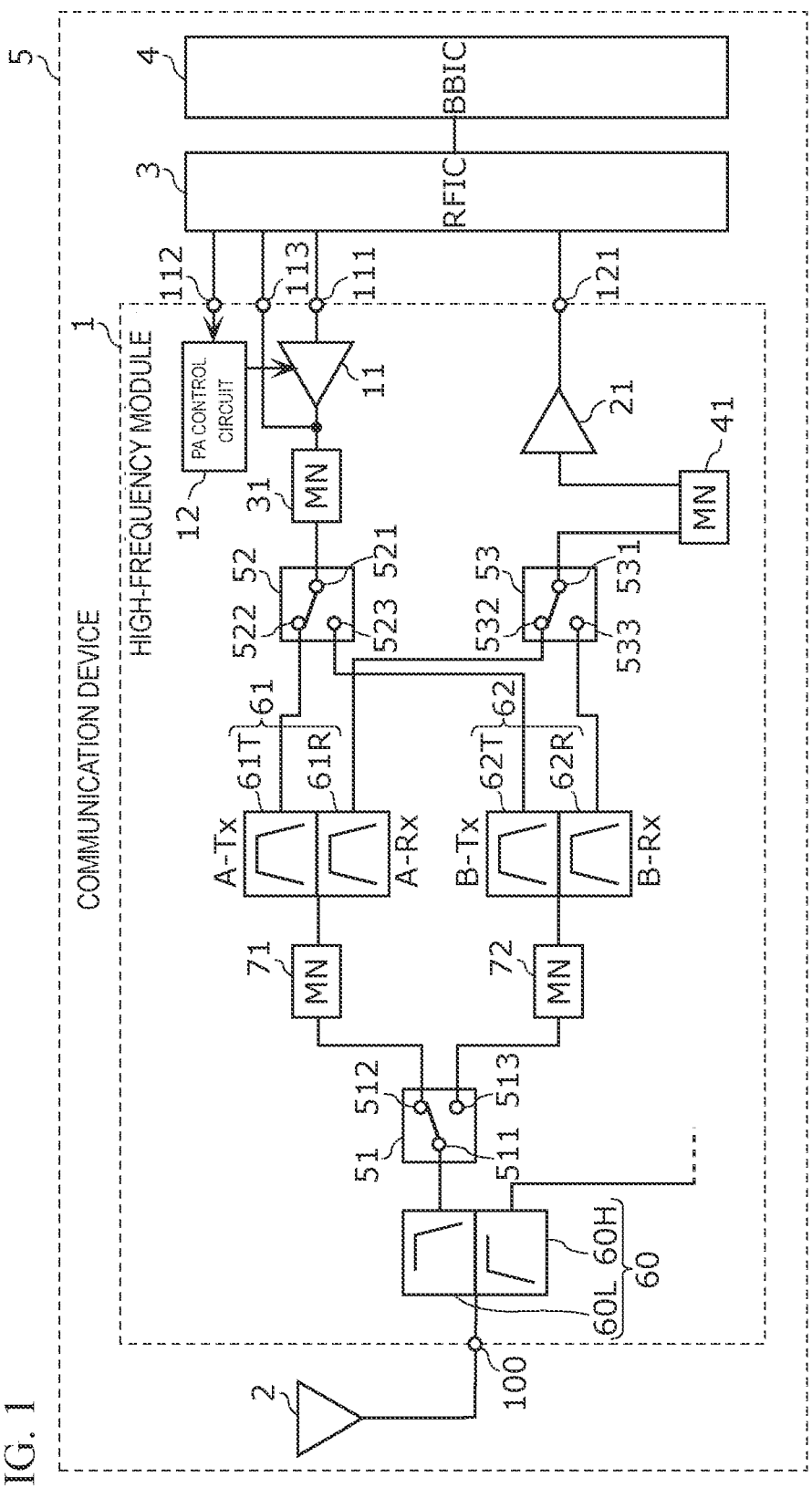
FIG. 1 is a circuit configuration diagram of a high-frequency module and a communication device according to an embodiment.

Hereinafter, a high-frequency module and a communication device according to an embodiment of the present disclosure will be described in detail with reference to the figures. Note that, any of the embodiments described below illustrates a specific example of the present disclosure. Thus, numerical values, shapes, materials, components, dispositions and connection forms of the components, and the like illustrated in the following embodiments are mere examples, and are not intended to limit the present disclosure. Thus, among the components in the following embodiments, components not recited in any of the independent claims will be described as optional components.

In addition, each figure is a schematic diagram, and is not necessarily strictly illustrated. Accordingly, for example, scales and the like do not necessarily coincide in the respective drawings. In addition, in the respective figures, substantially the same components are denoted by the same reference numerals, and redundant description thereof will be omitted or simplified.

In addition, in the present specification, a term indicating a relationship between elements such as parallel or perpendicular, a term indicating a shape of an element such as a rectangle or a straight line, and a numerical range do not express only strict meanings, but express substantially equivalent ranges, and mean that, for example, a difference of about several % is included.

In addition, in the present specification, terms "above" and "below" do not indicate an upward direction (vertically upward) and a downward direction (vertically downward) in absolute spatial recognition, but are used as terms defined by a relative positional relationship based on a stacking order in a stacked configuration. Thus, for example, an "upper surface" or a "top surface" of a component or member may refer to not only a vertically upper side surface but also various surfaces such as a vertically lower side surface, and a surface perpendicular to a horizontal direction, in an actual use mode. Note that, the "top surface" of the component or member means an uppermost surface of the component or member.

In addition, in the present specification and the figures, an x-axis, a y-axis, and a z-axis represent three axes of a three dimensional orthogonal coordinate system. When a shape in a plan view of a module substrate is a rectangle, the x-axis and the y-axis are in a direction parallel to a first side of the rectangular shape, and in a direction parallel to a second side orthogonal to the first side, respectively. The z-axis is in a thickness direction of the module substrate. Note that, in the present specification, the "thickness direction" of the module substrate refers to a direction orthogonal to a main surface of the module substrate.

In addition, in the present specification, "connected" includes not only a case of being directly connected by a connection terminal and/or a wiring conductor, but also a case of being electrically connected via another circuit element. In addition, "connected between A and B" means connection to both A and B between A and B.

In addition, in a component disposition of the present disclosure, "in a plan view of a module substrate" means that an object is orthographically projected onto an xy plane from a positive side in the z-axis and viewed. Further, "a component is disposed on a substrate" includes, in addition to a disposition of the component on the substrate in a state in which the component is in contact with the substrate, a disposition of the component above the substrate without necessarily the component being in contact with the substrate (for example, the component is stacked on another component disposed on the substrate), and a disposition where the component is partially or entirely embedded in the substrate. Additionally, "a component is disposed on a main surface of a substrate" includes, in addition to a disposition of the component on the main surface in a state in which the component is in contact with the main surface of the substrate, a disposition of the component above the main surface without necessarily the component being in contact with the main surface, and a disposition where the component is partially embedded in the substrate from a side of the main surface. Further, "A is disposed between B and C" means that at least one of a plurality of line segments connecting an arbitrary point in B and an arbitrary point in C passes through A.

Further, unless otherwise specified, ordinal numbers such as "first" and "second" in the present specification do not denote the number or an order of components, but are used to distinguish components of the same type from each other to avoid confusion.

Embodiment

[1. Circuit Configuration of High-Frequency Module and Communication Device]

A circuit configuration of a high-frequency module and a communication device according to an embodiment will be described using FIG. 1. FIG. 1 is a circuit configuration diagram of a high-frequency module 1 and a communication device 5 according to the present embodiment.

[1-1. Circuit Configuration of Communication Device]

First, a circuit configuration of the communication device 5 will be described. The communication device 5 is a device used in a communication system and is, for example, a mobile terminal such as a smart phone or a tablet computer. As illustrated in FIG. 1, the communication device 5 according to the present embodiment includes the high-frequency module 1, an antenna 2, an RF signal processing circuit (RFIC) 3, and a baseband signal processing circuit (BBIC) 4.

The high-frequency module 1 transmits a high-frequency signal between the antenna 2 and the RFIC 3. An internal configuration of the high-frequency module 1 will be described later.

The antenna 2 is connected to an antenna connection terminal 100 of the high-frequency module 1, transmits a high-frequency signal outputted from the high-frequency module 1, or receives a high-frequency signal from an outside and outputs the high-frequency signal to the high-frequency module 1.

The RFIC 3 is an example of a signal processing circuit that processes a high-frequency signal transmitted or received by the antenna 2. To be more specific, the RFIC 3 signal-processes a high-frequency reception signal inputted via a reception path of the high-frequency module 1 by down-conversion or the like, and outputs the signal-processed and generated reception signal to the BBIC 4. In addition, the RFIC 3 signal-processes a transmission signal inputted from the BBIC 4 by up-conversion or the like, and outputs the signal-processed and generated high-frequency transmission signal to a transmission path of the high-frequency module 1. Further, the RFIC 3 has a control unit that controls a switch, an amplifier, and the like included in the high-frequency module 1. Note that, some or all of functions of the RFIC 3 as the control unit may be implemented outside the RFIC 3, and for example, may be implemented in the BBIC 4 or the high-frequency module 1.

The BBIC 4 is a baseband signal processing circuit that performs signal processing using an intermediate-frequency band of frequencies lower than a high-frequency signal transmitted by the high-frequency module 1. As the signal processed in the BBIC 4, for example, an image signal for image display and/or an audio signal for communication via a speaker is used.

Note that, in the communication device 5 according to the present embodiment, the antenna 2 and the BBIC 4 are optional components.

[1-2. Circuit Configuration of High-Frequency Module]

Next, a circuit configuration of the high-frequency module 1 will be described. As illustrated in FIG. 1, the high-frequency module 1 includes a power amplifier 11, a PA control circuit 12, a low-noise amplifier 21, matching circuits 31 and 41, switches 51 to 53, a diplexer 60, duplexers 61 and 62, matching circuits 71 and 72, the antenna connection terminal 100, a high-frequency input terminal 111, a control input terminal 112, a power supply terminal 113, and a high-frequency output terminal 121.

The antenna connection terminal 100 is connected to the antenna 2.

The high-frequency input terminal 111 is a terminal for receiving a high-frequency transmission signal from an outside of the high-frequency module 1. In the present embodiment, the high-frequency input terminal 111 is a terminal for receiving transmission signals in communication bands A and B, from the RFIC 3.

The control input terminal 112 is a terminal for receiving a digital signal for controlling a gain of the power amplifier 11, and a power supply voltage and a bias voltage supplied to the power amplifier 11. For example, the control input terminal 112 is a Mobile Industry Processor Interface (MIPI) terminal, and receives a digital signal from the RFIC 3.

The power supply terminal 113 is a terminal that receives DC power that serves as a base of the power supply voltage and the bias voltage that are supplied to the power amplifier 11.

The high-frequency output terminal 121 is a terminal for providing a high-frequency reception signal to the outside of the high-frequency module 1. In the present embodiment, the high-frequency output terminal 121 is a terminal for providing reception signals in the communication bands A and B to the RFIC 3.

Note that, the communication band means a frequency band that is defined in advance by a standardization organization or the like (for example, 3rd Generation Partnership Project (3GPP), Institute of Electrical and Electronics Engineers (IEEE), or the like) for a communication system.

Here, the communication system means a communication system constructed by using a radio access technology (RAT). As the communication system, for example, a 5th Generation New Radio (5GNR) system, a Long Term Evolution (LTE) system, a Wireless Local Area Network (WLAN) system, and the like can be used, but the present disclosure is not limited thereto.

The communication band A is an example of a first communication band. The communication band B is an example of a second communication band. The communication bands A and B are communication bands different from each other. In the present embodiment, a communication band for frequency division duplex (FDD) is used as each of the communication bands A and B. To be more specific, as each of the communication bands A and B, band B1, band B2, band B3, or band B7 for LTE, or band n1, band n2, band n3, or band n7 for 5GNR is used, but the communication bands A and B are not limited thereto.

Alternatively, a communication band for time division duplex (TDD) may be used as at least one of the communication bands A and B. To be more specific, as at least one of the communication bands A and B, band B32, band B39, band B40 or band B41 for LTE, or band n39, band n40, or band n41 for 5GNR may be used.

The power amplifier 11 can amplify transmission signals in the communication bands A and B. Here, an input terminal of the power amplifier 11 is connected to the high-frequency input terminal 111, and an output terminal of the power amplifier 11 is connected to the matching circuit 31.

The configuration of the power amplifier 11 is not particularly limited. For example, the power amplifier 11 may have a single-stage configuration or a multi-stage configuration. For example, the power amplifier 11 may have a plurality of cascade-connected amplifying elements. Further, the power amplifier 11 may amplify a high-frequency signal by conversion into a differential signal (that is, a complementary signal). Such a power amplifier 11 may be referred to as a differential amplifier.

The PA control circuit 12 is an example of a control circuit that controls the power amplifier 11. The PA control circuit 12 controls a gain of the power amplifier 11 based on a digital signal inputted via the control input terminal 112.

The PA control circuit 12 is, for example, one semiconductor integrated circuit. The semiconductor integrated circuit is configured with, for example, a Complementary Metal Oxide Semiconductor (CMOS), and specifically, is configured by a Silicon on Insulator (SOI) process. Thus, the semiconductor integrated circuit can be manufactured at low cost. Note that, the semiconductor integrated circuit may be made of at least one of GaAs, SiGe, and GaN.

The low-noise amplifier 21 can amplify reception signals in the communication bands A and B received by the antenna connection terminal 100. Here, an input terminal of the low-noise amplifier 21 is connected to the matching circuit 41, and an output terminal of the low-noise amplifier 21 is connected to the high-frequency output terminal 121.

The configuration of the low-noise amplifier 21 is not particularly limited. For example, the low-noise amplifier 21 may have a single-stage configuration, or a multi-stage configuration. Further, the low-noise amplifier 21 may be a differential amplifier.

Note that, the power amplifier 11 and the low-noise amplifier 21 are each configured with, for example, a Si-based CMOS, or a field-effect transistor (FET) or a hetero-bipolar transistor (HBT) with GaAs as a material.

The diplexer 60 is an example of a multiplexer, and includes filters 60L and 60H. The filter 60L is a filter with a frequency range including the communication bands A and B as a pass band. The filter 60L is, for example, a low pass filter. The filter 60H is a filter with a frequency range including a communication band different from the communication bands A and B as a pass band. For example, the pass band of the filter 60H is a frequency band higher than the pass band of the filter 60L. The filter 60H is, for example, a high pass filter. At least one of the filters 60L and 60H may be a band pass filter or a band elimination filter.

The duplexer 61 is an example of a first filter having a pass band including the communication band A. The duplexer 61 causes a high-frequency signal in the communication band A to pass. The duplexer 61 transmits a transmission signal and a reception signal in the communication band A by an FDD method. The duplexer 61 includes a transmission filter 61T and a reception filter 61R.

The transmission filter 61T has a pass band that includes an uplink operating band of the communication band A. One end of the transmission filter 61T is connected to the antenna connection terminal 100 with the matching circuit 71 and the switch 51 interposed therebetween. Another end of the transmission filter 61T is connected to the output terminal of the power amplifier 11 with the switch 52 and the matching circuit 31 interposed therebetween.

An uplink operating band means a part of a communication band designated for an uplink. In the high-frequency module 1, the uplink operating band means a transmission band.

The reception filter 61R has a pass band that includes a downlink operating band of the communication band A. One end of the reception filter 61R is connected to the antenna connection terminal 100 with the matching circuit 71 and the switch 51 interposed therebetween. Another end of the reception filter 61R is connected to the input terminal of the low-noise amplifier 21 with the switch 53 and the matching circuit 41 interposed therebetween.

A downlink operating band means a part of a communication band designated for a downlink. In the high-frequency module 1, the downlink operating band means a reception band.

The duplexer 62 is an example of a second filter having a pass band including the communication band B. The duplexer 62 causes a high-frequency signal in the communication band B to pass. The duplexer 62 transmits a transmission signal and a reception signal in the communication band B by the FDD method. The duplexer 62 includes a transmission filter 62T and a reception filter 62R.

The transmission filter 62T has a pass band that includes an uplink operating band of the communication band B. One end of the transmission filter 62T is connected to the antenna connection terminal 100 with the matching circuit 72 and the switch 51 interposed therebetween. Another end of the transmission filter 62T is connected to the output terminal of the power amplifier 11 with the switch 52 and the matching circuit 31 interposed therebetween.

The reception filter 62R has a pass band that includes a downlink operating band of the communication band B. One end of the reception filter 62R is connected to the antenna connection terminal 100 with the matching circuit 72 and the switch 51 interposed therebetween. Another end of the reception filter 62R is connected to the input terminal of the low-noise amplifier 21 with the switch 53 and the matching circuit 41 interposed therebetween.

Each of the filters 60L and 60H, the transmission filters 61T and 62T, and the reception filters 61R and 62R is, for example, any one of an acoustic wave filter using a surface acoustic wave (SAW), an acoustic wave filter using a bulk acoustic wave (BAW), an LC resonant filter, and a dielectric filter, but is not limited thereto.

The switch 51 is an example of a first switch, and is connected between the antenna connection terminal 100 and each of the duplexers 61 and 62. The switch 51 is also referred to as an antenna switch. To be more specific, the switch 51 includes terminals 511 to 513. The terminal 511 is a common terminal connected to the antenna connection terminal 100 with the filter 60L interposed therebetween. The terminal 512 is a selection terminal connected to the transmission filter 61T and the reception filter 61R with the matching circuit 71 interposed therebetween. The terminal 513 is a selection terminal connected to the transmission filter 62T and the reception filter 62R with the matching circuit 72 interposed therebetween.

The switch 51 can connect any one of the terminals 512 and 513 to the terminal 511 based on, for example, a control signal from the RFIC 3. Thus, the switch 51 switches between (a) connection between the antenna connection terminal 100 and the transmission filter 61T and the reception filter 61R, and (b) connection between the antenna connection terminal 100 and the transmission filter 62T and the reception filter 62R. The switch 51 is, for example, a Single Pole Double Throw (SPDT) type switch circuit. Note that, the switch 51 may be a multi-connection type switch circuit capable of simultaneously performing the above connection (a) and connection (b).

The switch 52 is an example of a second switch, and is connected between each of the duplexers 61 and 62 and the power amplifier 11. To be more specific, the switch 52 includes terminals 521 to 523. The terminal 521 is a common terminal connected to the output terminal of the power amplifier 11 with the matching circuit 31 interposed therebetween. The terminal 522 is a selection terminal connected to the transmission filter 61T. The terminal 523 is a selection terminal connected to the transmission filter 62T.

The switch 52 can connect any one of the terminals 522 and 523 to the terminal 521 based on, for example, a control signal from the RFIC 3. Thus, the switch 52 switches between connection between the power amplifier 11 and the transmission filter 61T, and connection between the power amplifier 11 and the transmission filter 62T. The switch 52 is, for example, an SPDT type switch circuit.

The switch 53 is an example of a third switch, and is connected between each of the duplexers 61 and 62 and the low-noise amplifier 21. To be specific, the switch 53 includes terminals 531 to 533. The terminal 531 is a common terminal connected to the input terminal of the low-noise amplifier 21 with the matching circuit 41 interposed therebetween. The terminal 532 is a selection terminal connected to the reception filter 61R. The terminal 533 is a selection terminal connected to the reception filter 62R.

The switch 53 can connect any one of the terminals 532 and 533 to the terminal 531 based on, for example, a control signal from the RFIC 3. Accordingly, the switch 53 switches connection between the low-noise amplifier 21 and the reception filter 61R, and connection between the low-noise amplifier 21 and the reception filter 62R. The switch 53 is, for example, an SPDT type switch circuit.

The matching circuit 31 is connected to the output terminal of the power amplifier 11. To be specific, the matching circuit 31 is connected between the power amplifier 11 and the switch 52. The matching circuit 31 performs impedance matching between the power amplifier 11 and the transmission filter 61T of the duplexer 61 and the transmission filter 62T of the duplexer 62.

The matching circuit 41 is connected to the input terminal of the low-noise amplifier 21. To be specific, the matching circuit 41 is connected between the low-noise amplifier 21 and the switch 53. The matching circuit 41 performs impedance matching between the low-noise amplifier 21 and the reception filter 61R of the duplexer 61 and the reception filter 62R of the duplexer 62.

The matching circuit 71 is connected to the duplexer 61. To be specific, the matching circuit 71 is connected between each of the transmission filter 61T and the reception filter 61R and the switch 51. The matching circuit 71 performs impedance matching between each of the transmission filter 61T and the reception filter 61R and the antenna 2 and the switch 51.

The matching circuit 72 is connected to the duplexer 62. To be specific, the matching circuit 72 is connected between each of the transmission filter 62T and the reception filter 62R and the switch 51. The matching circuit 72 performs impedance matching between each of the transmission filter 62T and the reception filter 62R and the antenna 2 and the switch 51.

Further, each of the matching circuits 31, 41, 71, and 72 is formed using at least one of an inductor, a capacitor, and a resistor. For example, each of the matching circuits 31, 41, 71, and 72 includes a chip-like inductor. Note that, instead of the matching circuit 31, or in addition to the matching circuit 31, a matching circuit may be provided between the switch 52 and each of the transmission filters 61T and 62T. In addition, instead of the matching circuit 41, or in addition to the matching circuit 41, a matching circuit may be provided between the switch 53 and each of the reception filters 61R and 62R. In addition, instead of the matching circuits 71 and 72, or in addition to the matching circuits 71 and 72, a matching circuit may be provided between the switch 51 and the filter 60L. Further, a matching circuit may be provided between the antenna connection terminal 100 and the filter 60L.

Note that, the circuit configuration of the high-frequency module 1 is not limited to the example illustrated in FIG. 1. For example, the high-frequency module 1 may include at least one of a transmission circuit and a reception circuit that process a high-frequency signal passing through the filter 60H of the diplexer 60. Alternatively, the high-frequency module 1 may include an external connection terminal for input from a transmission circuit and/or output to a reception circuit, of a high-frequency signal passing through the filter 60H.

Further, some of the circuit elements illustrated in FIG. 1 need not be included in the high-frequency module 1. For example, the high-frequency module 1 need not include at least one of the matching circuits 31, 41, 71, and 72. In addition, the high-frequency module 1 need not include the diplexer 60.

[2. Component Disposition of High-Frequency Module]

Next, a plurality of examples of a component disposition of the high-frequency module 1 configured as described above will be described.

2-1. Example 1

Figure 2A:
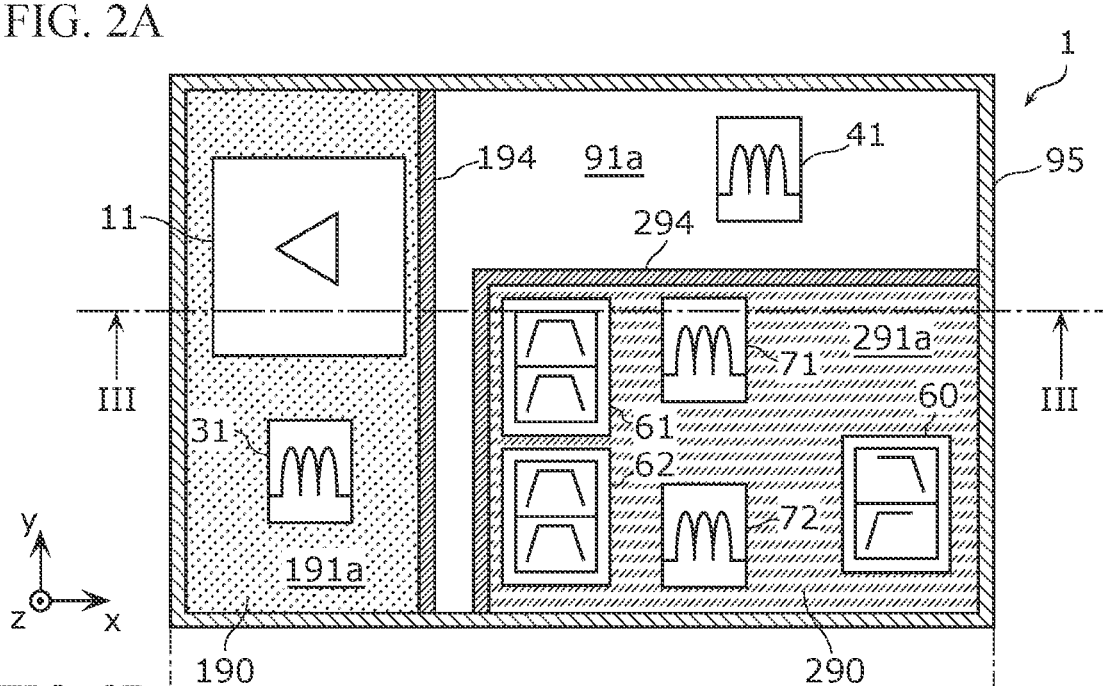
FIGS. 2A and 2B are plan views of a high-frequency module according to Example 1.
Figure 2B:
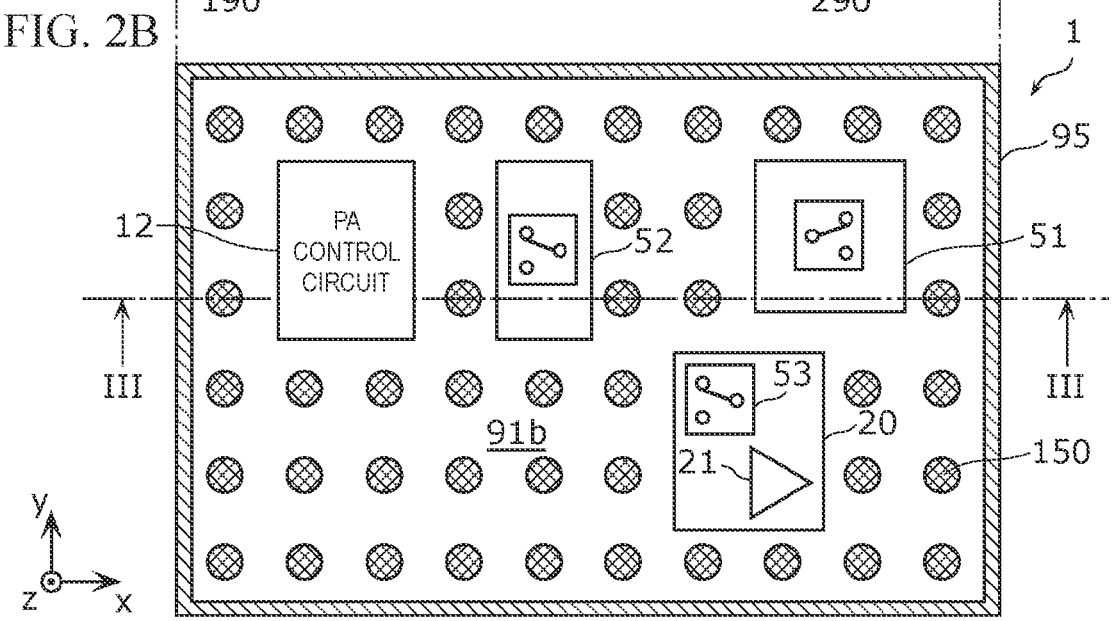
Figure 3:
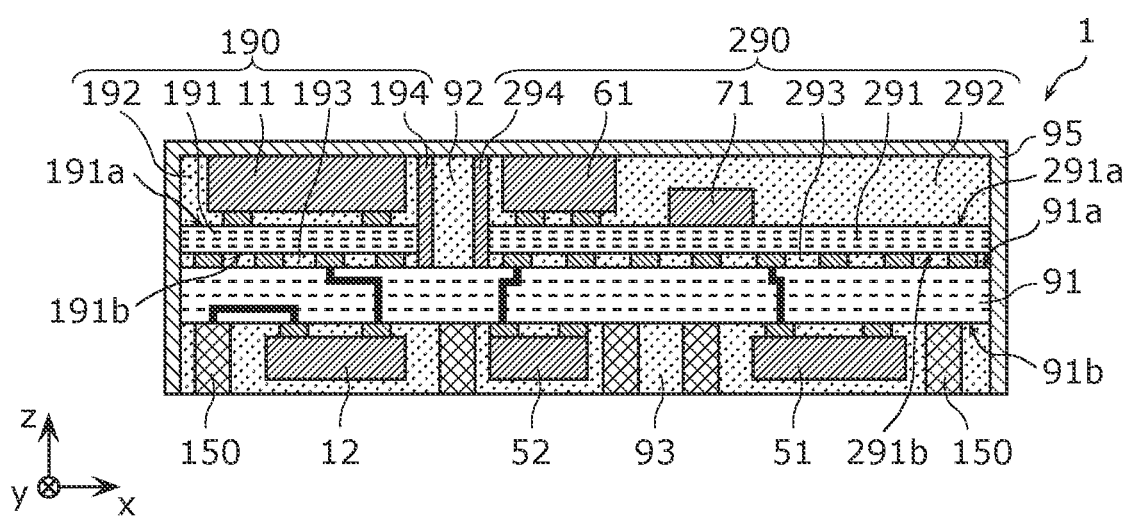
FIG. 3 is a sectional view of the high-frequency module according to Example 1.

First, Example 1 of the component disposition will be described using FIG. 2A, FIG. 2B, and FIG. 3. FIGS. 2A and 2B are plan views of the high-frequency module 1 according to Example 1. To be more specific, FIG. 2A is a diagram of a main surface 91a of a module substrate 91 viewed from the positive side in the z-axis. FIG. 2B is a diagram in which a main surface 91b of the module substrate 91 is seen through from the positive side in the z-axis. FIG. 3 is a sectional view of the high-frequency module 1 according to Example 1. The section of the high-frequency module 1 in FIG. 3 is a section taken along a line III-III in FIGS. 2A and 2B.

As illustrated in FIG. 2A, FIG. 2B, and FIG. 3, the high-frequency module 1 includes, in addition to the plurality of circuit components including the circuit elements illustrated in FIG. 1, the module substrate 91, resin members 92 and 93, a metal shield layer 95, and a plurality of external connection terminals 150. Note that, in FIGS. 2A and 2B, the resin members 92 and 93, and an upper part of the metal shield layer 95 are not illustrated.

As illustrated in FIG. 2A and FIG. 3, the high-frequency module 1 includes sub-module components 190 and 290. Each of the sub-module components 190 and 290 is an example of one or more module components. At least some of the circuit elements illustrated in FIG. 1 are included in the sub-module components 190 and 290. A specific configuration of the sub-module components 190 and 290 will be described later.

The module substrate 91 is an example of a first substrate, and has the main surface 91a and the main surface 91b opposite to the main surface 91a. In the present example, the module substrate 91 has a rectangular shape in a plan view, but the shape of the module substrate 91 is not limited thereto. As the module substrate 91, for example, a low temperature co-fired ceramics (LTCC) substrate having stacking structure of a plurality of dielectric layers, a high temperature co-fired ceramics (HTCC) substrate, a component-embedded substrate, a substrate having a redistribution layer (RDL), a printed board, or the like can be used, but the present disclosure is not limited thereto.

The main surface 91a is an example of a first main surface, and may be referred to as an upper surface or a front surface. As illustrated in FIG. 2A, the sub-module components 190 and 290, and the matching circuit 41 are disposed on the main surface 91a.

The main surface 91b is an example of a second main surface, and may be referred to as a lower surface or a rear surface. As illustrated in FIG. 2B, the PA control circuit 12, a semiconductor integrated circuit 20, the switches 51 and 52, and the plurality of external connection terminals 150 are disposed on the main surface 91b.

The semiconductor integrated circuit 20 is an electronic component having an electronic circuit formed on a surface and inside of a semiconductor chip (also referred to as a die). In the present embodiment, the semiconductor integrated circuit 20 includes the low-noise amplifier 21 and the switch 53. The semiconductor integrated circuit 20 may be, for example, configured with a CMOS, and specifically may be configured by an SOI process. This makes it possible to manufacture the semiconductor integrated circuit 20 at low cost. Note that, the semiconductor integrated circuit 20 may be made of at least one of GaAs, SiGe, and GaN. Thus, the semiconductor integrated circuit 20 of high quality can be realized.

The plurality of external connection terminals 150 includes a ground terminal in addition to the antenna connection terminal 100, the high-frequency input terminal 111, the control input terminal 112, the power supply terminal 113, and the high-frequency output terminal 121 illustrated in FIG. 1. Each of the external connection terminals 150 is connected to an input/output terminal and/or a ground terminal on a motherboard disposed on a negative side in the z-axis of the high-frequency module 1. The plurality of external connection terminals 150 is, for example, a post electrode penetrating through the resin member 93, but is not limited thereto.

The resin member 92 is an example of a first resin member, is disposed on the main surface 91a of the module substrate 91, and covers the main surface 91a. To be specific, the resin member 92 is provided so as to cover a region of the main surface 91a where the sub-module components 190 and 290 are not disposed. The resin member 92 covers the matching circuit 41 disposed in the region. Further, the resin member 92 covers a side surface of each of the sub-module components 190 and 290.

The resin member 93 is disposed on the main surface 91b of the module substrate 91, and covers the main surface 91b. To be specific, the resin member 93 is provided on an entirety of the main surface 91b, and covers the PA control circuit 12, the semiconductor integrated circuit 20, and the switches 51 and 52 disposed on the main surface 91b. In the present example, the plurality of external connection terminals 150 is provided so as to penetrate the resin member 93.

The metal shield layer 95 is an example of a first metal shield layer, and covers a top surface of the resin member 92, and a top surface of each of the sub-module components 190 and 290. The metal shield layer 95 further covers a side surface of the resin member 92, a side surface of each of the sub-module components 190 and 290, a side surface of the module substrate 91, and a side surface of the resin member 93. The metal shield layer 95 is a metal thin film formed by a sputtering method, for example. The metal shield layer 95 is set to ground potential, and suppresses exogenous noise from entering the circuit components constituting the high-frequency module 1.

The sub-module component 190 is an example of a second module component. The sub-module component 190 includes, in addition to the circuit component including at least one of the circuit elements illustrated in FIG. 1, a sub-module substrate 191, resin members 192 and 193, and a side surface shield layer 194. The sub-module component 190 includes the power amplifier 11, and the matching circuit 31, among the circuit elements illustrated in FIG. 1.

The sub-module substrate 191 is an example of a second substrate, and has a main surface 191a, and a main surface 191b opposite to the main surface 191a. In the present example, the sub-module substrate 191 has a rectangular shape in a plan view, but the shape of the sub-module substrate 191 is not limited thereto. In FIG. 2A, in order to make a range occupied by the sub-module substrate 191 easier to understand, the range is shaded with dots. The sub-module substrate 191 shares three sides (specifically, entirely one side and partially two sides) with the module substrate 91 in a plan view. As the sub-module substrate 191, for example, a low temperature co-fired ceramics substrate having stacking structure of a plurality of dielectric layers, a high temperature co-fired ceramics substrate, a component-embedded substrate, a substrate having a redistribution layer, a printed board, or the like can be used, but the present disclosure is not limited thereto.

The main surface 191a is an example of a third main surface, and may be referred to as an upper surface or a front surface. As illustrated in FIG. 2A, the power amplifier 11 and the matching circuit 31 are disposed on the main surface 191a.

The power amplifier 11 is an example of a first circuit component. In the present example, as illustrated in FIG. 3, a top surface of the power amplifier 11 contacts the metal shield layer 95. Note that, a side surface of the power amplifier 11 may contact the metal shield layer 95.

The matching circuit 31 is an example of a second circuit component. Note that, the matching circuit 31 may be disposed on the main surface 191b. At least one of a top surface and a side surface of the matching circuit 31 may or need not contact the metal shield layer 95.

The main surface 191b is an example of a fourth main surface, and may be referred to as a lower surface or a rear surface. The main surface 191b faces the main surface 91a of the module substrate 91. The main surface 191b is not disposed with a circuit component, and is disposed with one or more electrode terminals for electrical connection to the module substrate 91.

The resin member 192 is an example of a second resin member, is disposed on the main surface 191a of the sub-module substrate 191, and covers the main surface 191a. To be specific, the resin member 192 is provided so as to cover a region of the main surface 191a where the power amplifier 11 is not disposed. The resin member 192 covers the matching circuit 31 disposed in the region. Note that, as illustrated in FIG. 3, when a gap is provided between the power amplifier 11 and the main surface 191a, the resin member 192 may be provided so as to fill the gap.

The resin member 193 is an example of a third resin member, is disposed on the main surface 191b of the sub-module substrate 191, and covers the main surface 191b. To be specific, the resin member 193 is provided on an entirety of the main surface 191b. In the present example, a plurality of electrode terminals is provided so as to penetrate the resin member 193.

The side surface shield layer 194 is an example of a second metal shield layer, and covers a side surface of the resin member 192, a side surface of the sub-module substrate 191, and a side surface of the resin member 193. As illustrated in FIG. 3, an upper end surface (end surface on a top surface side) of the side surface shield layer 194 contacts the metal shield layer 95. Further, a lower end surface of the side surface shield layer 194 contacts the main surface 91a of the module substrate 91. The side surface shield layer 194 is a metal thin film formed by the sputtering method, for example.

As illustrated in FIG. 2A, the side surface shield layer 194 is provided along one side of the sub-module component 190 having a rectangular shape, in a plan view. Thus, the power amplifier 11 and the matching circuit 31 included in the sub-module component 190 are surrounded by the side surface shield layer 194 and the metal shield layer 95, in a plan view. Since the side surface shield layer 194 is set to the ground potential, electric field coupling, magnetic field coupling, and electromagnetic field coupling between the circuit component included in the sub-module component 190 and other circuit component can be suppressed.

Note that, the side surface shield layer 194 may cover each of four side surfaces of the sub-module component 190. In this case, the side surface shield layer 194 and the metal shield layer 95 are disposed as a double layer, and it is possible to more strongly suppress exogenous noise from entering.

In addition, in the present example, the top surface of the sub-module component 190 is a flat surface, and an entirety thereof contacts the metal shield layer 95. To be specific, the top surface of the power amplifier 11, a top surface of the resin member 192, and the upper end surface of the side surface shield layer 194 are flush with each other, and each contact the metal shield layer 95.

The sub-module component 290 is an example of a first module component. The sub-module component 290 includes, in addition to the circuit component including at least one of the circuit elements illustrated in FIG. 1, a sub-module substrate 291, resin members 292 and 293, and a side surface shield layer 294. The sub-module component 290 includes, among the circuit elements illustrated in FIG. 1, the diplexer 60, the duplexers 61 and 62, and the matching circuits 71 and 72.

The sub-module substrate 291 is an example of the second substrate, and has a main surface 291a, and a main surface 291b opposite to the main surface 291a. In the present example, the sub-module substrate 291 has a rectangular shape in a plan view, but the shape of the sub-module substrate 291 is not limited thereto. In FIG. 2A, in order to make a range occupied by the sub-module substrate 291 easier to understand, the range is shaded with oblique broken lines. The sub-module substrate 291 partially shares two sides with the module substrate 91, in a plan view. As the sub-module substrate 291, for example, a low temperature co-fired ceramics substrate having stacking structure of a plurality of dielectric layers, a high temperature co-fired ceramics substrate, a component-embedded substrate, a substrate having a redistribution layer, a printed board, or the like can be used, but the present disclosure is not limited thereto.

The main surface 291a is an example of the third main surface, and may be referred to as an upper surface or a front surface. As illustrated in FIG. 2A, the diplexer 60, the duplexers 61 and 62, and the matching circuits 71 and 72 are disposed on the main surface 291a.

Each of the duplexers 61 and 62 and the diplexer 60 is an example of the first circuit component. In the present example, as illustrated in FIG. 3, a top surface of the duplexer 61 contacts the metal shield layer 95. Although not illustrated, a top surface of each of the duplexer 62 and the diplexer 60 contacts the metal shield layer 95. Note that, a side surface of the duplexer 61 or 62 or the diplexer 60 may contact the metal shield layer 95. Further, the duplexer 62 and the diplexer 60 may be examples of the second circuit component, and the top surfaces thereof need not contact the metal shield layer 95. Alternatively, the duplexer 62 and the diplexer 60 may be disposed on the main surface 291b.

The matching circuits 71 and 72 are examples of the second circuit component. Note that, the matching circuits 71 and 72 may be disposed on the main surface 291b. At least one of a top surface and a side surface of each of the matching circuits 71 and 72 may or need not contact the metal shield layer 95.

The main surface 291b is an example of the fourth main surface, and may be referred to as a lower surface or a rear surface. The main surface 291b faces the main surface 91a of the module substrate 91. The main surface 291b is not disposed with a circuit component, and is disposed with one or more electrode terminals for electrical connection with the module substrate 91.

The resin member 292 is an example of the second resin member, is disposed on the main surface 291a of the sub-module substrate 291, and covers the main surface 291a. To be specific, the resin member 292 is provided so as to cover a region of the main surface 291a where the diplexer 60 and the duplexers 61 and 62 are not disposed. The resin member 292 covers the matching circuits 71 and 72 disposed in the region. Note that, when a gap is provided between the duplexer 61 and the main surface 291a as illustrated in FIG. 3, the resin member 292 may be provided so as to fill the gap. The same applies to the diplexer 60 and the duplexer 62.

The resin member 293 is an example of the third resin member, is disposed on the main surface 291b of the sub-module substrate 291, and covers the main surface 291b. To be specific, the resin member 293 is provided on an entirety of the main surface 291b. In the present example, a plurality of electrode terminals is provided so as to penetrate the resin member 293.

The side surface shield layer 294 is an example of the second metal shield layer, and covers a side surface of the resin member 292, a side surface of the sub-module substrate 291, and a side surface of the resin member 293. As illustrated in FIG. 3, an upper end surface (end surface on a top surface side) of the side surface shield layer 294 contacts the metal shield layer 95. Further, a lower end surface of the side surface shield layer 294 contacts the main surface 91a of the module substrate 91. The side surface shield layer 294 is a metal thin film formed by the sputtering method, for example.

As illustrated in FIG. 2A, the side surface shield layer 294 is provided in an L shape along two sides of the sub-module component 290 having a rectangular shape, in a plan view. Thus, the diplexer 60, the duplexers 61 and 62, and the matching circuits 71 and 72 included in the sub-module component 290 are surrounded by the side surface shield layer 294 and the metal shield layer 95, in a plan view. Since the side surface shield layer 294 is set to the ground potential, electric field coupling, magnetic field coupling, and electromagnetic field coupling between the circuit component included in the sub-module component 290 and other circuit component can be suppressed.

Note that, the side surface shield layer 294 may cover each of four side surfaces of the sub-module component 290. In this case, the side surface shield layer 294 and the metal shield layer 95 are disposed as a double layer, and it is possible to more strongly suppress exogenous noise from entering.

In addition, in the present example, a top surface of the sub-module component 290 is a flat surface, and an entirety thereof contacts the metal shield layer 95. To be specific, the top surface of the diplexer 60, the top surface of each of the duplexers 61 and 62, a top surface of the resin member 292, and the upper end surface of the side surface shield layer 294 are flush with each other, and each contact the metal shield layer 95.

In the present example, the respective top surfaces of the sub-module components 190 and 290 and the resin member 92 are flush with each other. The flush top surfaces (that is, a flat surface) are formed by disposing the sub-module components 190 and 290 and the matching circuit 41 on the main surface 91a of the module substrate 91, molding with a resin material to be a base of the resin member 92, curing the resin material, and then polishing the cured resin material from a top surface side. By polishing so as to expose the respective top surfaces of the sub-module components 190 and 290, or by further polishing the respective exposed top surfaces of the sub-module components 190 and 290, the respective top surfaces of the sub-module components 190 and 290 and the resin member 92 can be made flush with each other.

Note that, when the side surface shield layers 194 and 294 are formed, a metal shield layer may be formed on the respective top surfaces of the sub-module components 190 and 290 at the same time. The metal shield layer formed on the respective top surfaces of the sub-module components 190 and 290 is removed by polishing, but may be left without necessarily being removed. That is, the metal shield layer provided on the respective top surfaces of the sub-module components 190 and 290 may be provided in contact with the metal shield layer 95.

2-2. Example 2

Figure 4A:
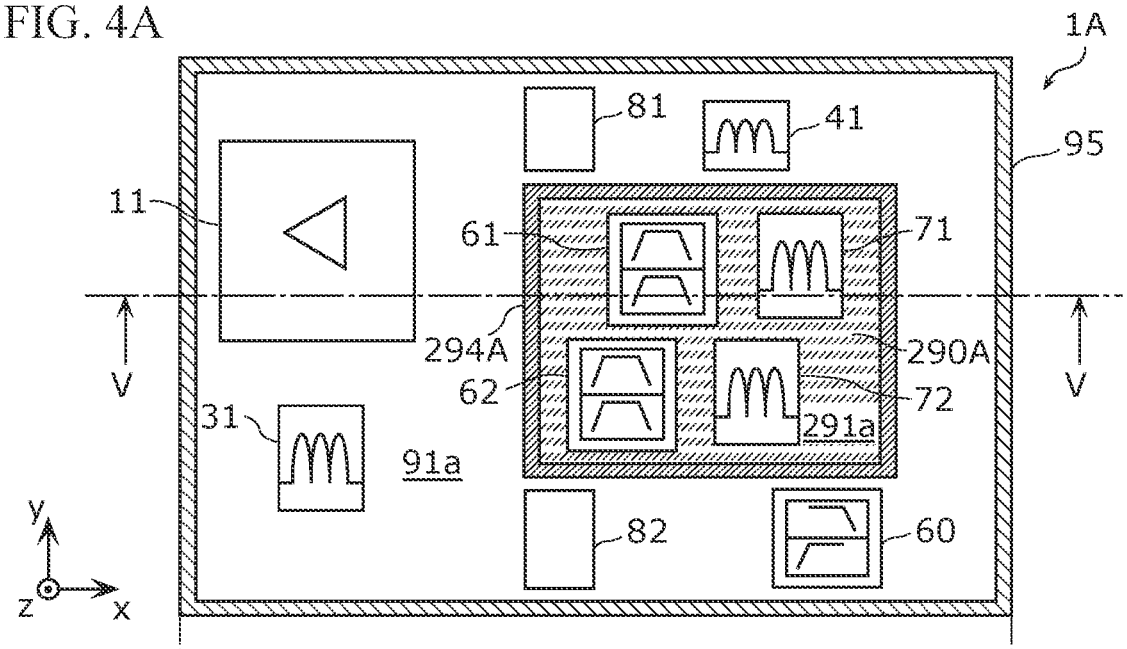
FIGS. 4A and 4B are plan views of a high-frequency module according to Example 2.
Figure 4B:
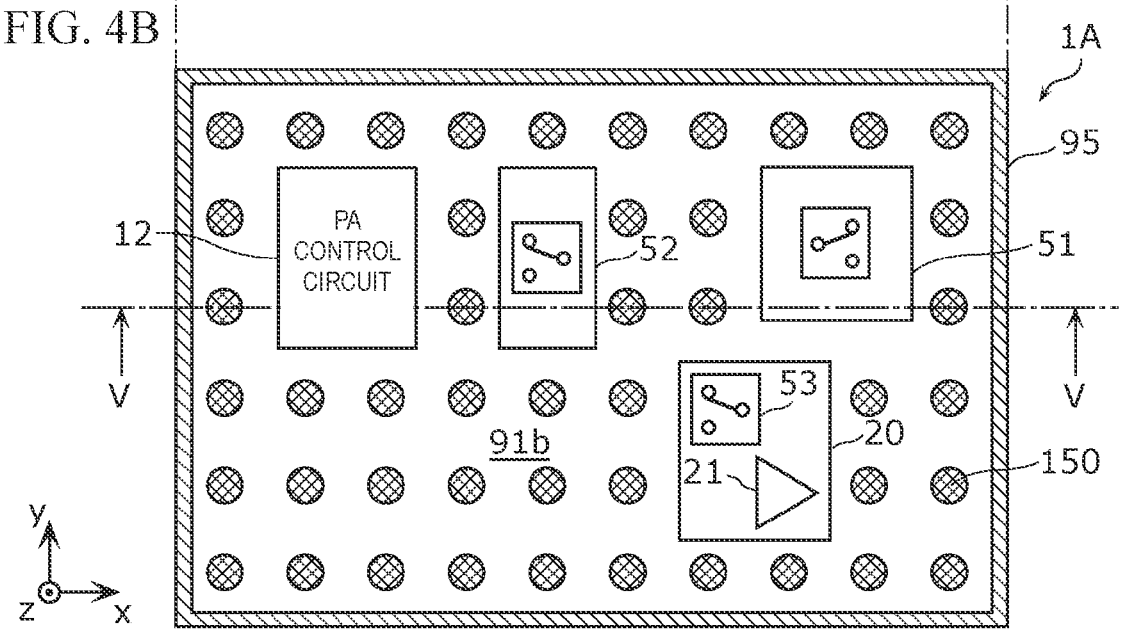
Figure 5:
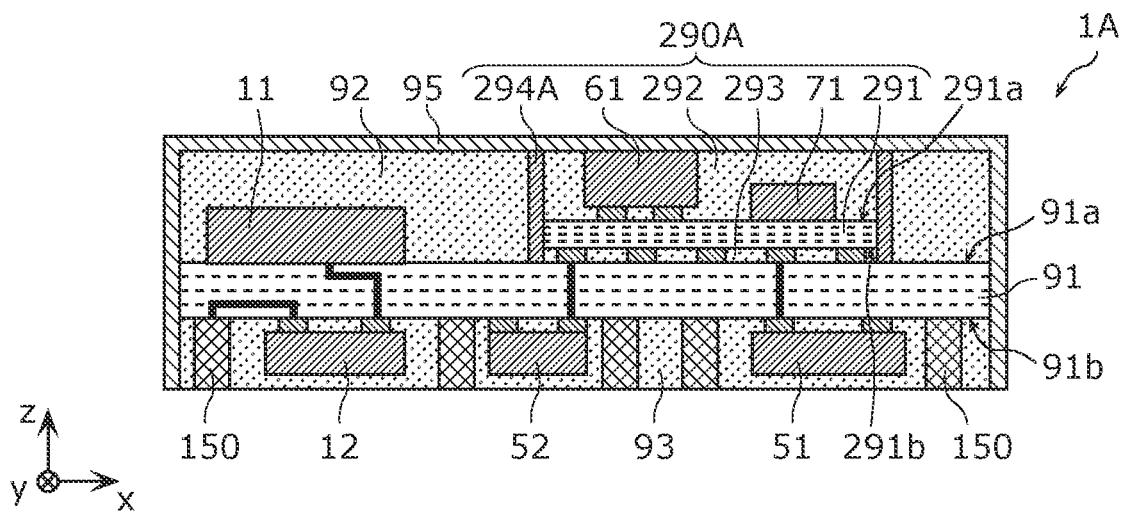
FIG. 5 is a sectional view of the high-frequency module according to Example 2.

Next, Example 2 of the component disposition will be described using FIG. 4A, FIG. 4B, and FIG. 5. FIGS. 4A and 4B are plan views of a high-frequency module 1A according to Example 2. To be more specific, FIG. 4A is a diagram of the main surface 91a of the module substrate 91 viewed from the positive side in the z-axis. FIG. 4B is a diagram in which the main surface 91b of the module substrate 91 is seen through from the positive side in the z-axis. FIG. 5 is a sectional view of the high-frequency module 1A according to Example 2. The section of the high-frequency module 1A in FIG. 5 is a section taken along a line V-V in FIGS. 4A and 4B.

As illustrated in FIG. 4A, FIG. 4B, and FIG. 5, the high-frequency module 1A according to Example 2 differs from Example 1 mainly in that one sub-module component 290A is included instead of the two sub-module components 190 and 290.

As illustrated in FIG. 4A, the sub-module component 290A is provided near a center of the main surface 91a of the module substrate 91. To be specific, in a plan view, the sub-module component 290A does not share a side with the module substrate 91. For this reason, a side surface shield layer 294A of the sub-module component 290A is provided in a rectangular ring shape over an entire periphery of the sub-module component 290A, in a plan view. That is, the side surface shield layer 294A is provided on all of four side surfaces of the sub-module component 290A.

Further, the sub-module component 290A does not include the diplexer 60. The diplexer 60 is disposed on the main surface 91a of the module substrate 91. In addition, in the present example, the power amplifier 11 and the matching circuit 31 are disposed on the main surface 91a of the module substrate 91.

Further, the high-frequency module 1A includes two dummy members 81 and 82. The dummy members 81 and 82 are, for example, conductive members set to the ground potential. The dummy members 81 and 82 may be soldered metal plates, or metal layers grown by plating.

Each of the dummy members 81 and 82 is disposed between the side surface shield layer 294A of the sub-module component 290A and the metal shield layer 95, in a plan view. For example, the dummy member 81 is disposed so as to fill more than half of a space between the side surface shield layer 294A and the metal shield layer 95. To be specific, when focused on a length along the y-axis, a width of the dummy member 81 (length along the y-axis) is greater than a sum of an interval between the dummy member 81 and the metal shield layer 95, and an interval between the dummy member 81 and the side surface shield layer 294A. Note that, the dummy member 81 may contact at least one of the side surface shield layer 294A and the metal shield layer 95. The same applies to the dummy member 82.

The dummy member 81 is disposed between the matching circuit 41 and the power amplifier 11, in a plan view. Thus, by the dummy member 81, electric field coupling, magnetic field coupling, and electromagnetic field coupling between the power amplifier 11 and the matching circuit 41 can be suppressed. Thus, isolation between transmission and reception can be improved.

The dummy member 82 is disposed between the matching circuit 31 or the power amplifier 11 and the diplexer 60, in a plan view. Thus, by the dummy member 82, electric field coupling, magnetic field coupling, and electromagnetic field coupling between the matching circuit 31 or the power amplifier 11 and the diplexer 60 can be suppressed.

Note that, as in the present example, when the high-frequency module 1A includes only one sub-module component, a type of circuit element included in the sub-module component is not particularly limited. For example, the high-frequency module 1A may include the sub-module component 190 including the power amplifier 11 instead of the sub-module component 290A.

2-3. Example 3

Figure 6:
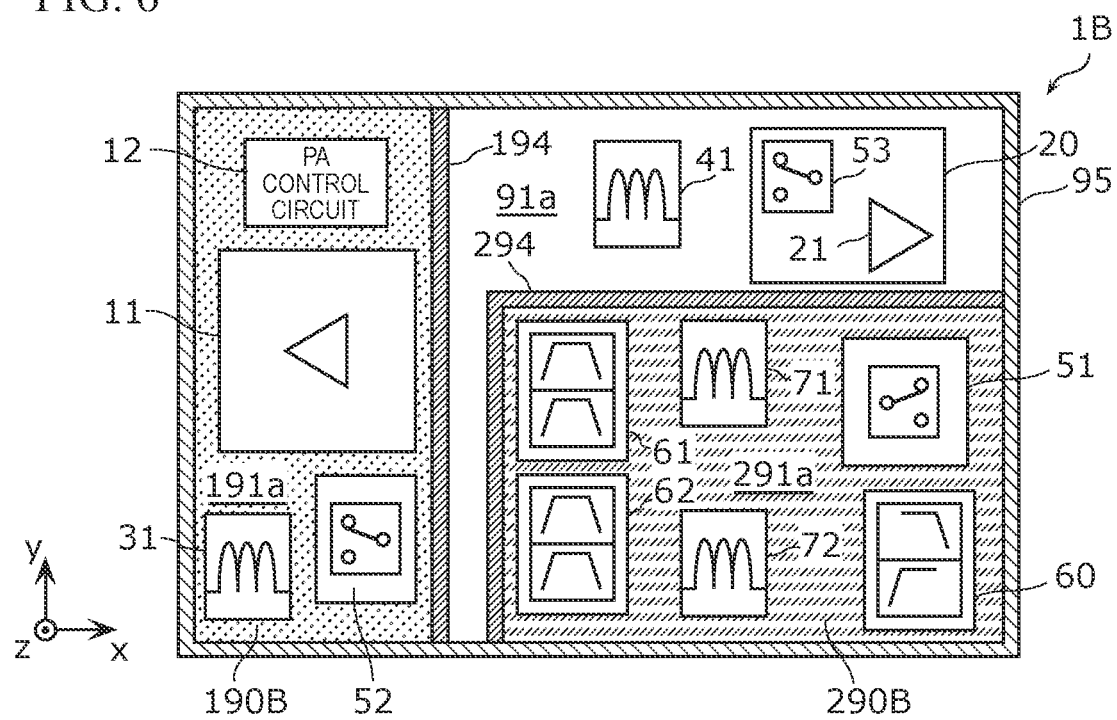
FIG. 6 is a plan view of a high-frequency module according to Example 3.

Next, Example 3 of the component disposition will be described using FIG. 6. FIG. 6 is a plan view of a high-frequency module 1B according to Example 3.

As illustrated in FIG. 6, the high-frequency module 1B according to Example 3 differs from Example 1 mainly in that all of the circuit elements (except for the terminals) illustrated in FIG. 1 are disposed on the main surface 91a. That is, the high-frequency module 1B is a module in which a single side is mounted.

To be specific, as illustrated in FIG. 6, the high-frequency module 1B includes sub-module components 190B and 290B.

The sub-module component 190B includes the power amplifier 11, the PA control circuit 12, the matching circuit 31, and the switch 52. Here, each of the PA control circuit 12, the matching circuit 31, and the switch 52 is an example of the second circuit component.

The sub-module component 290B includes the diplexer 60, the switch 51, the duplexers 61 and 62, and the matching circuits 71 and 72. Here, the switch 51 and the matching circuits 71 and 72 are examples of the second circuit component.

In the present example, the semiconductor integrated circuit 20 including the low-noise amplifier 21 and the switch 53, and the matching circuit 41 are directly disposed on the main surface 91a of the module substrate 91.

Note that, in the present example, the high-frequency module 1B need not include the sub-module component 190B. To be specific, the power amplifier 11, the PA control circuit 12, the matching circuit 31, and the switch 52 may be directly disposed on the main surface 91a of the module substrate 91. Alternatively, the high-frequency module 1B need not include the sub-module component 290B. For example, the diplexer 60, the duplexers 61 and 62, and the matching circuits 71 and 72 may be disposed directly on the main surface 91a of the module substrate 91. Further, the high-frequency module 1B may include a sub-module component including the semiconductor integrated circuit 20 including the low-noise amplifier 21 and the switch 53, and the matching circuit 41.

3. Effects and the Like

As described above, the high-frequency module 1 according to the present embodiment includes the module substrate 91 having the main surfaces 91a and 91b, the one or more module components disposed on the main surface 91a, the resin member 92 covering the main surface 91a, and the metal shield layer 95 covering the top surface of each of the resin member 92 and the one or more module components, and set to the ground potential. The sub-module component 190, which is one of the one or more module components, has the sub-module substrate 191 having the main surfaces 191a and 191b, the first circuit component disposed on the main surface 191a, the one or more second circuit components disposed on the main surface 191a or 191b, the resin member 192 covering the main surface 191a, and the side surface shield layer 194 covering the side surface of each of the resin member 192 and the sub-module substrate 191, and set to the ground potential. The end surface on the top surface side of the side surface shield layer 194 contacts the metal shield layer 95.

Thus, the side surface shield layer 194 of the sub-module component 190 functions as a shield member that suppresses electric field coupling, magnetic field coupling, and electromagnetic field coupling between the components. That is, it is optional to separately prepare a shield member, and it is possible to suppress electric field coupling, magnetic field coupling, and electromagnetic field coupling between the circuit components disposed on the sub-module component 190, and the circuit components disposed on the other sub-module components and the module substrate 91, only by mounting the sub-module component 190 on the main surface 91a. Thus, it is possible to suppress noise from entering a high-frequency signal processed by each element. Since a step of separately forming a shield member can be omitted, the manufacturing process of the high-frequency module 1 can be simplified.

For example, since it is possible to suppress some of transmission signals having large power from flowing into the reception path as noise, it is possible to improve the NF. In addition, for example, it is possible to suppress harmonic distortion of a transmission signal generated in the power amplifier 11 from going around via the switch 51, the diplexer 60, and the matching circuits 71 and 72, and being emitted from the antenna 2. As described above, the high-frequency module 1 according to the present embodiment is capable of easily improving electrical characteristics.

In addition, for example, as in the sub-module component 290A of Example 2, by covering the entire side surfaces thereof with the side surface shield layer 294A, electric field coupling, magnetic field coupling, and electromagnetic field coupling between the circuit components included in the sub-module component 290A and the other components can be suppressed, regardless of the disposition position of the sub-module component 290A. Thus, by collecting the components for which electric field coupling, magnetic field coupling, and electromagnetic field coupling with the other components are desired to be suppressed in the sub-module component 290A in advance, electric field coupling, magnetic field coupling, and electromagnetic field coupling with the other components can be easily suppressed. Since a degree of freedom of the disposition position of the sub-module component 290A can also be increased, a degree of freedom of design of the disposition of the components on the module substrate 91 is increased, which contributes to miniaturization.

Further, for example, the sub-module component 190 further includes the resin member 193 that covers the main surface 191b. The side surface shield layer 194 further covers the side surface of the resin member 193.

Thus, a shielding function of the side surface shield layer 194, that is, the function of suppressing electric field coupling, magnetic field coupling, and electromagnetic field coupling with the other components can be enhanced.

Thereby, the electrical characteristics of the high-frequency module 1 can be further improved.

Also, for example, the main surface 191b faces the main surface 91a, and the top surface of the first circuit component contacts the metal shield layer 95.

Thus, heat caused to be generated in the first circuit component can be transmitted to the metal shield layer 95, and easily released. Thus, heat dissipation performance of the sub-module component 190 can be enhanced. In addition, by eliminating a gap between the first circuit component and the metal shield layer 95, a height of the high-frequency module 1 can be reduced.

Also, for example, the side surface shield layer 194 contacts the main surface 91a.

Thus, the shielding function of the side surface shield layer 194 can be further enhanced. Thereby, the electrical characteristics of the high-frequency module 1 can be further improved.

In addition, for example, the top surface of the resin member 92, the top surface of the resin member 192, and the upper end surface of the side surface shield layer 194 are flush with each other.

Thus, since a top surface portion of the metal shield layer 95 can be made flat, it is possible to form the metal shield layer 95 with less film breakage or the like, and having good film quality. Thus, the shielding function can be enhanced, and the electrical characteristics of the high-frequency module 1 can be improved.

Further, for example, the first circuit component of the sub-module component 290, which is one of the one or more module components, is the duplexer 61 having the pass band including the communication band A. In addition, for example, the one or more second circuit components of the sub-module component 290 include the matching circuit 71 connected to the first filter (specifically, the duplexer 61). In addition, for example, the one or more second circuit components of the sub-module component 290 include the second filter (specifically, the duplexer 62) having the pass band including the communication band B.

Accordingly, it is possible to suppress electric field coupling, magnetic field coupling, and electromagnetic field coupling between the power amplifier 11 and/or the matching circuit 31, and the duplexers 61 and 62 and/or the matching circuit 71 included in the sub-module component 290. Thus, it is possible to suppress some of transmission signals having large power from flowing into the reception path as noise. Thus, it is possible to increase the isolation between the transmission and reception, and to improve the electrical characteristics of the high-frequency module 1.

In addition, for example, as illustrated in FIG. 6, the one or more second circuit components of the sub-module component 290B which is one of the one or more module components include the switch 51 connected between the antenna connection terminal 100 and each of the duplexers 61 and 62.

Accordingly, it is possible to suppress electric field coupling, magnetic field coupling, and electromagnetic field coupling between the switch 51 and the power amplifier 11. Thus, for example, it is possible to suppress harmonic distortion of a transmission signal generated in the power amplifier 11 from going around via the switch 51 and being emitted from the antenna 2.

In addition, for example, the first circuit component of the sub-module component 190B which is one of the one or more module components is the power amplifier 11. The one or more second circuit components of the sub-module component 190B include the switch 52 connected between each of the duplexers 61 and 62 and the power amplifier 11. Also, for example, the one or more second circuit components of the sub-module component 190B include the PA control circuit 12 that controls the power amplifier 11.

Accordingly, since the power amplifier 11, the switch 52, and/or the PA control circuit 12 are included in the sub-module component 190B, it is possible to suppress some of transmission signals having large power from flowing into a reception path provided outside the sub-module component 190B as noise. Thus, isolation between transmission and reception can be enhanced, and electrical characteristics of the high-frequency module 1B can be improved.

Further, for example, the high-frequency module 1B further includes the low-noise amplifier 21 and the switch 53 connected to each of the duplexers 61 and 62 and the low-noise amplifier 21. The low-noise amplifier 21 and the switch 53 are disposed on the main surface 91a.

This enables the single sided mounting to the module substrate 91, so that a height of the high-frequency module 1B can be reduced.

In addition, for example, as illustrated in FIG. 2B or FIG. 4B, the first circuit component of the sub-module component 190, which is one of the one or more module components, is the power amplifier 11. The high-frequency module 1 further includes the low-noise amplifier 21, the switch 51 connected between the antenna connection terminal 100 and each of the duplexers 61 and 62, the switch 52 connected between each of the duplexers 61 and 62 and the power amplifier 11, and the switch 53 connected between each of the duplexers 61 and 62 and the low-noise amplifier 21. The low-noise amplifier 21 and the switches 51 to 53 are disposed on the main surface 91b. In addition, for example, the high-frequency module 1 or 1A further includes the PA control circuit 12 that is disposed on the main surface 91b and controls the power amplifier 11.

This enables double sided mounting to the module substrate 91, so that an area of the high-frequency module 1 or the 1A can be reduced.

Further, for example, as described above, the first filter and the second filter are the duplexers 61 and 62, respectively.

Accordingly, it is possible to increase the isolation between the transmission and reception, and to improve the electrical characteristics of the high-frequency module 1.

In addition, for example, as illustrated in FIGS. 2A and 2B, the first circuit component of the sub-module component 190, which is one of the one or more module components, is the power amplifier 11. In addition, for example, the one or more second circuit components of the sub-module component 190 include the matching circuit 31 connected to the output terminal of the power amplifier 11.

Accordingly, it is possible to suppress some of transmission signals having large power from flowing into the reception path as noise. Thus, it is possible to increase the isolation between the transmission and reception, and to improve the electrical characteristics of the high-frequency module 1.

In addition, for example, the communication device 5 according to the present embodiment includes the RFIC 3 that processes a high-frequency signal transmitted or received by the antenna 2, and the high-frequency module 1 that transmits a high-frequency signal between the antenna 2 and the RFIC 3.

Accordingly, it is possible to obtain the same effects as those of the above-described high-frequency module 1.

(Others)

Hereinbefore, although the high-frequency module and the communication device according to the present disclosure have been described based on the above-described embodiment, the present disclosure is not limited to the above-described embodiment.

For example, the sub-module component 190 need not include the resin member 193 covering the main surface 191b. In this case, the side surface shield layer 194 need not contact the main surface 91a of the module substrate 91. When a gap is provided between the main surface 191b of the sub-module substrate 191 of the sub-module component 190 and the main surface 91a of the module substrate 91, the resin member 92 may be provided so as to fill the gap.

In addition, for example, the sub-module component 190 need not have a circuit component disposed on the main surface 191a. All of the circuit components and terminals included in the sub-module component 190 may be disposed only on the main surface 191b. In this case, the main surface 191b facing the main surface 91a of the module substrate 91 is an example of the third main surface, and the main surface 191a is an example of the fourth main surface. At this time, the main surface 191a of the sub-module component 190 contacts the metal shield layer 95. That is, the main surface 191a and the upper end surface of the side surface shield layer 194 are flush with each other.

Note that, modifications that can be applied to the sub-module component 190 can also be applied to the sub-module components 190B, 290, 290A, and 290B.

Further, for example, the top surface of the power amplifier 11 need not contact the metal shield layer 95. The respective top surfaces of the diplexer 60 and the duplexers 61 and 62 need not contact the metal shield layer 95. Alternatively, the top surface of at least one of the PA control circuit 12, the matching circuits 31, 71, and 72, and the switches 51 and 52 may contact the metal shield layer 95. Further, when the semiconductor integrated circuit 20 including the low-noise amplifier 21 and the switch 53, and the matching circuit 41 are included in a sub-module component, at least one of the semiconductor integrated circuit 20 and the matching circuit 41 may or need not contact the metal shield layer 95.

In addition, a combination, the number, a disposition, and the like of circuit elements included in the sub-module component 190, 190B, 290, 290A, or 290B are not particularly limited. Circuit elements that are not included in a sub-module component may be disposed on any of the main surfaces 91a and 91b of the module substrate 91. Further, for example, the external connection terminal 150 may be a bump electrode or a planar electrode. Similarly, the electrode terminal of the sub-module component 190, 190B, 290, 290A, or 290B may be a post electrode, a bump electrode, or a planar electrode.

In addition, an embodiment obtained by applying various modifications conceived by a person skilled in the art to each embodiment, and an embodiment realized by arbitrarily combining components and functions in each embodiment without necessarily departing from the gist of the present disclosure are also included in the present disclosure.

INDUSTRIAL APPLICABILITY

The present disclosure can be used in, for example, communication equipment such as a mobile phone, as a high-frequency module disposed in a front end portion.

REFERENCE SIGNS LIST 1, 1A, 1B HIGH-FREQUENCY MODULE
2 ANTENNA
3 RFIC
4 BBIC
5 COMMUNICATION DEVICE
11 POWER AMPLIFIER
12 PA CONTROL CIRCUIT
20 SEMICONDUCTOR INTEGRATED CIRCUIT
21 LOW-NOISE AMPLIFIER
31, 41, 71, 72 MATCHING CIRCUIT
51, 52, 53 SWITCH
60 DIPLEXER
61, 62 DUPLEXER
60H, 60L FILTER
61R, 62R RECEPTION FILTER
61T, 62T TRANSMISSION FILTER
81, 82 DUMMY MEMBER
91 MODULE SUBSTRATE
91a, 91b, 191a, 191b, 291a, 291b MAIN SURFACE
92, 93, 192, 193, 292, 293 RESIN MEMBER
95 METAL SHIELD LAYER
194, 294, 294A SIDE SURFACE SHIELD LAYER
100 ANTENNA CONNECTION TERMINAL
111 HIGH-FREQUENCY INPUT TERMINAL
112 CONTROL INPUT TERMINAL
113 POWER SUPPLY TERMINAL
121 HIGH-FREQUENCY OUTPUT TERMINAL
150 EXTERNAL CONNECTION TERMINAL
190, 190B, 290, 290A, 290B SUB-MODULE COMPONENT
191, 291 SUB-MODULE SUBSTRATE
511, 512, 513, 521, 522, 523, 531, 532, 533 TERMINAL

The invention claimed is:

1. A high-frequency module, comprising:
a first substrate having a first main surface, and a second main surface opposite to the first main surface;
one or more circuit module components disposed on the first main surface;
a first resin that covers the first main surface; and
a first metal shield layer that covers a top surface of each of the first resin and the one or more circuit module components, and that is at ground potential,
wherein each of the one or more circuit module components comprises:
a second substrate having a third main surface, and a fourth main surface opposite to the third main surface,
a first circuit component disposed on the third main surface,
one or more second circuit components disposed on the third main surface or the fourth main surface,
a second resin covering the third main surface,
a second metal shield layer covering a side surface of each of the second resin and the second substrate, and that is at ground potential, and
a third resin covering the fourth main surface,
wherein an end surface on a side of the top surface of the second metal shield layer contacts the first metal shield layer, and
wherein the second metal shield layer covers a side surface of the third resin.

2. The high-frequency module according to claim 1,
wherein the fourth main surface faces the first main surface, and
wherein a top surface of the first circuit component contacts the first metal shield layer.

3. The high-frequency module according to claim 1, wherein the second metal shield layer contacts the first main surface.

4. The high-frequency module according to claim 1, wherein a top surface of the first resin, a top surface of the second resin, and the end surface of the second metal shield layer are flush with each other.

5. The high-frequency module according to claim 1, wherein the first circuit component of a first circuit module component is a first filter having a pass band comprising a first communication band.

6. The high-frequency module according to claim 1, wherein the first circuit component is a power amplifier, the first circuit component being of a second circuit module component that is one of the one or more circuit module components.

7. A communication device, comprising:
   an RF signal processing circuit configured to process a high-frequency signal transmitted or received by an antenna; and
   the high-frequency module according to claim 1 configured to transmit the high-frequency signal between the antenna and the RF signal processing circuit.

8. The high-frequency module according to claim 5, wherein the one or more second circuit components of the first circuit module component comprises a matching circuit connected to the first filter.

9. The high-frequency module according to claim 5, wherein the one or more second circuit components of the first circuit module component comprises a second filter having a pass band comprising a second communication band, the second communication band being different than the first communication band.

10. The high-frequency module according to claim 6, wherein the one or more second circuit components of the second circuit module component comprises a matching circuit connected to an output terminal of the power amplifier.

11. The high-frequency module according to claim 9, wherein the one or more second circuit components of the first circuit module component further comprises a first switch connected between an antenna connection terminal and each of the first filter and the second filter.

12. The high-frequency module according to claim 9,
   wherein the first circuit component of a second circuit module component is a power amplifier, and
   wherein the one or more second circuit components of the second module component comprises a second switch connected between each of the first filter and the second filter and the power amplifier.

13. The high-frequency module according to claim 9, further comprising:
   a low-noise amplifier; and
   a third switch connected to each of the first filter and the second filter and the low-noise amplifier,
   wherein the low-noise amplifier and the third switch are disposed on the first main surface.

14. The high-frequency module according to claim 9,
   wherein the first circuit component of a second circuit module component is a power amplifier,
   wherein the high-frequency module further comprises:
      a low-noise amplifier,
      a first switch connected between an antenna connection terminal and each of the first filter and the second filter,
      a second switch connected between each of the first filter and the second filter and the power amplifier, and
      a third switch connected to each of the first filter and the second filter and the low-noise amplifier, and
   wherein the low-noise amplifier, the first switch, the second switch, and the third switch are disposed on the second main surface.

15. The high-frequency module according to claim 9, wherein each of the first filter and the second filter is a duplexer.

16. The high-frequency module according to claim 12, wherein the one or more second circuit components of the second circuit module component further comprises a control circuit configured to control the power amplifier.

17. The high-frequency module according to claim 14, further comprising:
   a control circuit disposed on the second main surface and configured to control the power amplifier.

* * * * *